United States Patent

[11] 3,600,706

[72] Inventor Dean D. Ritchie
Streamwood, Ill.

[21] Appl. No. 854,101
[22] Filed Aug. 29, 1969
[45] Patented Aug. 17, 1971

[73] Assignee Standard Kollsman Industries, Inc.
Melrose Park, Ill.

[54] VARACTOR CONTROLLED AFC CIRCUIT FOR WIDE BAND TUNER
3 Claims, 2 Drawing Figs.

[52] U.S. Cl. .......... 331/177 V, 307/320, 334/15
[51] Int. Cl. .......... H03j 3/18
[50] Field of Search .......... 307/320; 334/15, 16; 331/177, 34—36, 36 C; 332/30 V

[56] References Cited

UNITED STATES PATENTS

| | | | |
|---|---|---|---|
| 3,110,004 | 11/1963 | Pope | 334/15 |
| 3,177,454 | 4/1965 | Van Dijkum et al. | 334/15 |
| 3,295,070 | 12/1966 | Tewksbury et al. | 334/15 X |
| 3,382,463 | 5/1968 | Hurtig | 331/177 X |
| 3,503,011 | 3/1970 | Keller | 334/15 X |

FOREIGN PATENTS

| | | | |
|---|---|---|---|
| 1,065,146 | 4/1967 | Great Britain | 307/320 |

OTHER REFERENCES

" Using Varactors to Extend Frequency-Control Range," Prouty in " Electronics" Nov. 8, 1963; pages 48— 49

*Primary Examiner*—Herman Karl Saalbach
*Assistant Examiner*—Marvin Nussbaum
*Attorneys*—E. Manning Giles, J. Patrick Cagney, Peter S. Lucyshyn and Richard G. Kinney

ABSTRACT: An AFC control circuit for an oscillator that is tunable over a wide frequency band produces a relatively constant frequency change or "pull-in" range at any frequency value within the band. The control circuit is connected across the main capacitance of the oscillator's resonant circuit and is comprised of a varactor and a parallel inductance that define a reference resonant frequency lower than any frequency value within the band. The control circuit exhibits an effective capacity at all frequencies of interest and the varactor provides a change in such effective capacity which is related to operating frequency in a manner to achieve the uniform "pull-in" characteristic.

INVENTOR
Dean D. Ritchie
BY J. Patrick Cagney
ATTORNEY

VARACTOR CONTROLLED AFC CIRCUIT FOR WIDE BAND TUNER

BACKGROUND OF THE INVENTION

There is need for simplified and less expensive AFC control circuits for high frequency oscillators having resonant circuits that operate over a wide frequency band. For example, in VHF television tuners the oscillator frequency is 101 MHz. when the tuner is set for channel 2 and is 257 MHz. when the tuner is set for channel 13.

A voltage-variable capacitor or varactor can be controlled by DC voltage from an AFC line to provide a capacitance that is coupled to the resonant circuit of the oscillator for modifying its frequency. Where the oscillator resonant circuit employs variable inductance to cover the tuning range, the resonant circuit maintains a reasonably constant capacitance. The use of a varactor alone in conjunction with such a resonant circuit produces a frequency change in proportion to actual frequency so that the "pull-in" range becomes excessive at higher frequencies.

SUMMARY OF THE INVENTION

The present invention provides an AFC control circuit having a relatively constant frequency change or "pull-in" range at any frequency value.

In accordance with the present invention, an AFC control circuit is provided for coupling to the resonant circuit of a high frequency oscillator that is tunable over a wide band, the control circuit presenting an effective capacitance coupled across the main capacitance of the resonant circuit to modify the operating frequency. The AFC control circuit is characterized by a varactor coupled to an AFC voltage line and an inductance in parallel with the varactor and defining therewith a resonant frequency lower than the operating frequency of the oscillator.

The AFC parallel resonant circuit of the varactor and inductance exhibits an effective capacitance that is variable with the oscillator frequency. The degree of such capacitance variation depends upon the relationship between the resonant frequency of the AFC circuit and the operating frequency of the oscillator.

The impedance of the AFC resonant circuit is limited by providing a shunt resistance across the inductance.

Other features and advantages of the invention will be apparent from the following description and claims, and are illustrated in the accompanying drawings which show structure embodying features of the present invention and the principles thereof.

BRIEF DESCRIPTION OF THE DRAWINGS

In the accompanying drawings forming a part of the specification, and in which like numerals are employed to designate like parts throughout the same.

Figure 1:
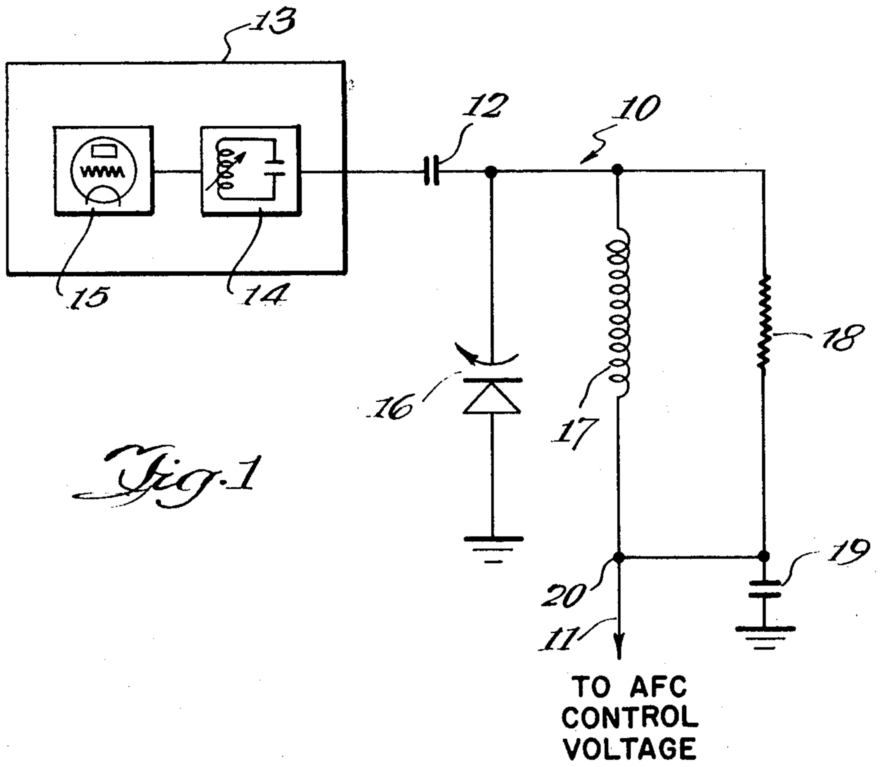
FIG. 1 is a circuit diagram showing the connection of the AFC control circuit to the resonant circuit of an oscillator.

Referring now to the drawings, for purposes of illustrative disclosure, an improved AFC control circuit 10 is shown supplied with a DC signal from an AFC control voltage line 11. The AFC control circuit is connected through a coupling capacitor 12 to control an oscillator stage 13 of a VHF television tuner. When the frequency of the IF signal is not precisely centered on the discriminator (not shown), a DC voltage is developed on the line 11 to vary the effective capacity of the AFC control circuit 10 which is shunted across the resonant circuit 14 that controls the operating frequency of the active element 15 of the oscillator 13.

In the preferred embodiment, the AFC control circuit 10 consists of a voltage-variable capacitor or varactor 16 connected between the coupling capacitor 12 and ground, a parallel inductance 17 connected to the AFC line 11, a shunt resistor 18 and a bypass capacitor 19 connected between ground and the junction 20 of line 11 and elements 17, 18.

The anode of the varactor 16 is connected to ground and the bypass capacitor 19 places the junction 20 at ground potential for AC signals but not for DC.

The DC voltage applied to the varactor 16 over the AFC line 11 is polarized to back-bias the varactor. If the oscillatOr 13 should tend to drift due to temperature or other effects, the value of the AFC voltage varies to produce a compensating change in the effective capacitance of the varactor 16 and thereby produce a corrective frequency shift at the oscillator. This eliminates the need for frequent fine tuning adjustment of the oscillator.

The shunt connected resistor 18 is utilized to prevent the impedance of the shunt resonant circuit 16, 17 from reaching a value where the peaks of the oscillator voltage across the varactor 16 would exceed the minimum back-bias on the varactor. This would restrict the range of capacitance variation obtainable from a given range of AFC voltage.

The actual amount of the frequency shift effected through the AFC control 10 is a function of the manner in which the change in varactor capacitance is coupled to the oscillator resonant circuit 14 and the percentage of total tuning capacitance represented by the change in varactor capacitance.

In the particular embodiment illustrated herein, the resonant circuit of the oscillator is of the variable inductance type so that the capacitance of the oscillator resonant circuit 14 is reasonably constant over the tuning range.

If the varactor 16 is used alone (that is, without the parallel inductance 17) to effect automatic frequency control of the substantially constant capacity resonant circuit of the oscillator, there would result a constant percentage capacity change so as to produce a frequency change in direct proportion to the actual frequency. Thus, if a given AFC control voltage change produced a frequency change of 2.0 mc. for television channel 2, the same control voltage change would produce a frequency change of 5.0 mc. for television channel 13.

In accordance with the present invention, a relatively constant frequency change is effected throughout the tuning range for a given AFC voltage change such that a reasonably constant "pull-in" range is maintained. This desirable relationship is achieved by causing the capacitance change for a given AFC voltage change to vary in a predetermined relationship.

In the illustrated arrangement, the inductance 17 is shunted across the varactor 16 with respect to the frequency ranges of interest to constitute a parallel resonant circuit having a reference resonant frequency lower than the oscillator frequency which is to be automatically controlled. For all frequencies above the reference frequency, the combination of C for varactor 16 and L for inductance 17 appears as a capacitance reactance.

Figure 2:
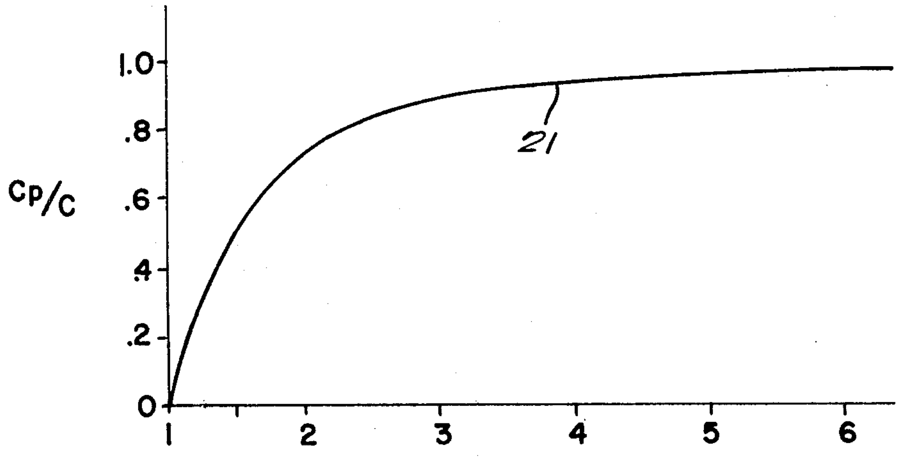
FIG. 2 is a graph showing the characteristic variation of capacitance with frequency provided by the AFC resonant circuit of the invention.

FIG. 2 shows a curve 21 representing the apparent value of the capacitive reactance of the parallel circuit $C_p$ for various values of frequency (*f*) above the resonant frequency (*fr*) of the parallel circuit based on the assumption that the reactances of varactor 16 and inductance 17 are lossless and the resistor 18 is infinite.

The curve 21 is drawn to show the parallel circuit capacitance $C_p$ as a ratio of the capacitance C of the varactor. It is apparent from the curve that the farther the parallel resonant frequency is located from the desired frequency, the closer the effective value of the parallel circuit capacitance $C_p$ approaches the capacitance C of the varactor 16.

To illustrate the typical change in capacitance for the parallel resonant circuit shown in FIG. 1 as applied to the channel frequencies of a VHF television tuner, Tables I and II are presented herein based on certain additional assumptions and definitions.

The varactor 16 is assumed to change in a ratio of 2 to 1 for the change in applied AFC voltage. Thus, the varactor 16 may range between a capacitance C1 that determines a reference resonant frequency *f*1 for the parallel circuit 16, 17 and a capacitance 2 C1 that determines a resonant frequency 0.707 *f*1 for the parallel circuit 16, 17.

Selected operating frequencies for the oscillator of a VHF tuner are as follows:

*f*2=101 MHz., oscillator frequency for channel 2
*f*6=129 MHz., oscillator frequency for channel 6
*f*7=221 MHz., oscillator frequency for channel 7
*f*13=257 MHz., oscillator frequency for channel 13.

Different reference values for *f*1 are chosen, namely 66 MHz. for Table I and 80 MHz. for Table II, to show the manner in which the capacitance change at any given oscillator frequency is affected by the amount of separation between the reference resonant frequency and the frequency tuning range of interest. This capacitance change is here defined in terms of a capacitance ratio CR which is computed at any given oscillator frequency by calculating the ratio of $C_p$ based on he capacitance value C1 for the varactor and $C_p$ based on the capacitance value *C*2=2*C*1 for the varactor.

Typical calculations are given with respect to the channel 2 oscillator frequency of 101 MHz. (See Table I, line 1—*f*2—) to illustrate the calculations appearing in the tables. Where a given varactor capacitance C1 is assumed, the reference resonant frequency is *f*1=66 MHz. so that the ratio *f*/*f*1=101/66=1.53. From FIG. 2 this ratio determines an effective capacity $C_p$ of 0.57 C1. Where a given varactor capacitance 2C1 is assumed the parallel resonant frequency is 0.707 *f*1=46.7 MHz. so that the frequency ratio =101/46.7=2.16. From FIG. 2, this determines an effective capacity of 0.786×2*C*1=1.527 *C*1. CR is then given as 1.572*C*1/0.57*C*1=2.75 to 1.

Whereas the capacitance ratio would be 2:1 for each of the channel frequencies *f*2 through *f*13 when the varactor 16 is used without the inductance 17, it will be apparent from Table I that the capacitance ratio CR varies from 2.75:1 at *f*2 to 2.07:1 at *f*13 when the parallel resonant circuit 16, 17 has a nominal resonant frequency of 66 MHz. and it will be apparent from Table II that the capacitance ratio varies from 3.68:1 at *f*2 to 2.10:1 at *f*13 when the parallel resonant circuit 16, 17 has a nominal resonant frequency of 80 MHz.

The effect may also be stated in relation to the ratio of the capacitance ratio CR at *f*2 to the capacitance ratio CR at *f*13. Thus, without inductance 17, the ratio of CR (*f*2) to CR (*f*13) is 1:1 but with inductance 17 this ratio is 1.33:1 as determined by Table I and 1.75:1 as determined by Table II. This ratio may be made larger or smaller by varying the relationship of the reference resonant frequency *f*1 to the frequency value of the tuning range *f*2 to *f*13.

It should be noted that the AFC control circuit 10 of this invention is connected in shunt with the main capacitance of the oscillator resonant circuit 14. This shunt connection applies both where a parallel resonant circuit is used in the oscillator stage and where a series resonant circuit is used in the oscillator stage. The invention is applicable to tunable circuits other than for television tuners.

TABLE I f1=66 mHz.; 0.707 f1=46.7 mHz.; C2=2C1

| Osc. freq. | f/f1 | Cp/C1 | f/0.707 f1 | Cp/C2 | Cp/C1 | CR |
|---|---|---|---|---|---|---|
| f2 | 1.53 | .572 | 2.16 | .786 | 1.572 | 2.75:1 |
| f6 | 1.95 | .738 | 2.76 | .869 | 1.738 | 2.35:1 |
| f7 | 3.35 | .911 | 4.74 | .956 | 1.912 | 2.10:1 |
| f13 | 3.9 | .934 | 5.51 | .967 | 1.934 | 2.07:1 |

TABLE II f1=80 mHz.; 0.707 f1=56.6 mHz.; C2=2C1

| Osc. freq. | f/f1 | Cp/C1 | f/0.707 f1 | Cp/C2 | Cp/C1 | CR |
|---|---|---|---|---|---|---|
| f2 | 1.26 | .373 | 1.78 | .685 | 1.37 | 3.68:1 |
| f6 | 1.61 | .577 | 2.28 | .789 | 1.578 | 2.73:1 |
| f7 | 2.76 | .869 | 3.90 | .934 | 1.868 | 2.15:1 |
| f13 | 3.22 | .903 | 4.55 | .952 | 1.904 | 2.10:1 |

What I claim is:

1. An AFC control circuit for coupling to a tunable resonant circuit of a variable high frequency oscillator such as a television tuner oscillator, said resonant circuit including an inductance and a main capacitance and being tunable over a wide band, said control circuit presenting an effective capacitance coupled across the main capacitance of the resonant circuit to modify the operating frequency thereof in a relationship to provide a substantially uniform pull-In characteristic over said band and characterized by a voltage variable diode capacitance coupled to an AFC voltage line, an inductance in parallel with said diode capacitance and defining therewith a resonant frequency lower than the operating frequency of said oscillator and a resistance connected in parallel with said diode capacitance to determine a maximum impedance limit for said control circuit.

2. An AFC control circuit in accordance with claim 1 and including a coupling capacitor connected to one side of the control circuit, a bypass capacitor connected to the other side of the control circuit, said resistance connected between said coupling capacitor and said bypass capacitor.

3. An AFC control circuit in accordance with claim 1 and wherein said diode capacitance is connected to the AFC voltage line through said inductance.